United States Patent
Ghantasala et al.

(10) Patent No.: US 10,283,320 B2
(45) Date of Patent: May 7, 2019

(54) PROCESSING CHAMBER HARDWARE FAULT DETECTION USING SPECTRAL RADIO FREQUENCY ANALYSIS

(71) Applicant: APPLIED MATERIALS, INC., Santa Clara, CA (US)

(72) Inventors: Sathyendra K. Ghantasala, Fremont, CA (US); Vijayakumar C. Venugopal, Berkeley, CA (US); Hyun-Ho Doh, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 167 days.

(21) Appl. No.: 15/349,139

(22) Filed: Nov. 11, 2016

(65) Prior Publication Data

US 2018/0138015 A1    May 17, 2018

(51) Int. Cl.
  *G01R 27/04*  (2006.01)
  *H01J 37/32*  (2006.01)

(52) U.S. Cl.
  CPC ........ *H01J 37/32082* (2013.01); *G01R 27/04* (2013.01); *H01J 37/32935* (2013.01); *H01J 2237/334* (2013.01)

(58) Field of Classification Search
  CPC ... G01R 27/04; G01R 31/11; H01J 37/32082; H01J 37/32935; G06F 17/00; G01N 30/8686; G01N 21/359; G05B 23/0254; H04B 3/46
  USPC ................ 356/301; 700/110; 702/35, 57, 58
  See application file for complete search history.

(56) References Cited

U.S. PATENT DOCUMENTS

| 6,826,489 B2 | 11/2004 | Scanlan et al. |
| 8,399,827 B1* | 3/2013 | Grothe ................ H01J 49/0036 250/282 |
| 2005/0009093 A1* | 1/2005 | Engkvist ................ C40B 30/02 435/7.1 |
| 2005/0115824 A1* | 6/2005 | Donohue ........... G05B 23/0229 204/192.12 |
| 2006/0021580 A1* | 2/2006 | Hirano .............. H01J 37/32082 118/722 |

(Continued)

FOREIGN PATENT DOCUMENTS

| JP | 2005514790 A | 5/2005 |
| JP | 2015106484 A | 6/2015 |

OTHER PUBLICATIONS

International Search Report and Written Opinion from PCT/US2017/056200 dated Jan. 23, 2018, 11 pgs.

*Primary Examiner* — John E Breene
*Assistant Examiner* — Jeffrey P Aiello
(74) *Attorney, Agent, or Firm* — Schwabe, Williamson & Wyatt, P.C.

(57) ABSTRACT

A method of assigning faults to a processing chamber is described. Some embodiments include applying a radio frequency (RF) signal to a processing chamber to stimulate resonance in the chamber, measuring resonances of the applied RF signal in the chamber, extracting a fingerprint from the measured resonances, comparing the extracted fingerprint to a library of fingerprints, assigning a similarity index to combinations of the extracted fingerprint with at least one fingerprint in the fingerprint library, comparing each similarity index to a threshold, and if the similarity is greater than a threshold, then assigning a fault to the processing chamber using the library fingerprint.

20 Claims, 4 Drawing Sheets

(56) References Cited

U.S. PATENT DOCUMENTS

| | | |
|---|---|---|
| 2006/0049831 A1 | 3/2006 | Anwar et al. |
| 2007/0284246 A1 | 12/2007 | Keil et al. |
| 2011/0290024 A1* | 12/2011 | Lefler ............... G01H 1/003 |
| | | 73/579 |
| 2013/0013274 A1* | 1/2013 | Grothe, Jr. .......... H01J 49/0036 |
| | | 703/2 |
| 2015/0048862 A1 | 2/2015 | Na et al. |
| 2015/0182143 A1* | 7/2015 | Hirata ............... A61B 5/055 |
| | | 600/408 |
| 2016/0091591 A1* | 3/2016 | Grodzki ........... G01R 33/56509 |
| | | 324/309 |
| 2016/0109498 A1* | 4/2016 | Jafarian-Tehrani ........................ |
| | | H01R 13/506 |
| | | 324/537 |
| 2016/0295675 A1 | 10/2016 | Yuzurihara et al. |
| 2017/0011255 A1* | 1/2017 | Kaditz ............... G01R 33/48 |
| 2017/0108566 A1* | 4/2017 | Fenchel ............ G01R 33/4828 |
| 2018/0031653 A1* | 2/2018 | Boernert ........... G01R 33/4625 |
| 2018/0150617 A1* | 5/2018 | Richardson ........... G06F 19/703 |

\* cited by examiner

PROCESSING CHAMBER HARDWARE FAULT DETECTION USING SPECTRAL RADIO FREQUENCY ANALYSIS

FIELD

The present description pertains to plasma processing chambers and in particular to determining faults in a chamber using a spectral radio frequency analysis.

BACKGROUND

In the manufacture of semiconductor chips and microelectronic devices, a silicon wafer or other substrate is exposed to a variety of different processes in different processing chambers. The chambers expose the wafer to a number of different chemical and physical processes whereby minute integrated circuits are created on the substrate. Layers of materials which make up the integrated circuit are created by processes including chemical vapor deposition, physical vapor deposition, epitaxial growth, and the like. Some of the layers of material are patterned using photoresist masks and wet or dry etching techniques. The substrates may be silicon, gallium arsenide, indium phosphide, glass, or other appropriate materials.

In these manufacturing processes, plasma may be used for depositing or etching various material layers. Plasma processing offers many advantages over thermal processing. For example, plasma enhanced chemical vapor deposition (PECVD) allows deposition processes to be performed at lower temperatures and at higher deposition rates than in analogous thermal processes. PECVD therefore allows material to be deposited at lower temperatures.

The processing chambers used in these processes have many components to control temperature, gas concentrations and pressures, high frequency radio waves, applied electrical charges, relative difference between different parts and many other parameters of the process. At the same time because the features formed on the workpiece are very small, the processing parameters must be controlled very precisely. In addition, the workpieces must be able to be placed in and out of a chamber quickly to minimize fabrication delays.

Any fault or mismatch in the hardware, configuration, or parts in the chamber setup can render the processes in the chamber difficult to precisely control or may simply change the parameters of a process. This affects how the device on the wafer is fabricated and may reduce yields or cause bad batches. In some cases, there may be a tool down situation with the chamber. These events can potentially result in unscheduled downtime, yield loss or wafer scrap.

Chambers are normally inspected and tested by opening the chamber and manually inspecting each of the components. The same is true for troubleshooting hardware installation issues, such as misplaced parts, missed RF (Radio Frequency) gaskets, etc. This kind of inspection and test is slow and requires that the chamber be taken out of production, flushed and allowed to cool followed by a long recovery process.

BRIEF SUMMARY

A method of assigning faults to a processing chamber is described. Some embodiments include applying a radio frequency (RF) signal to a processing chamber to stimulate resonance in the chamber, measuring resonances of the applied RF signal in the chamber, extracting a fingerprint from the measured resonances, comparing the extracted fingerprint to a library of fingerprints, assigning a similarity index to combinations of the extracted fingerprint with at least one fingerprint in the fingerprint library, comparing each similarity index to a threshold, and if the similarity is greater than a threshold, then assigning a fault to the processing chamber using the library fingerprint.

BRIEF DESCRIPTION OF THE DRAWINGS

Embodiments of the present invention are illustrated by way of example, and not limitation, in the figures of the accompanying drawings in which.

DETAILED DESCRIPTION

As described herein, faults in a semiconductor or microelectronic processing chamber setup may be detected using automated impedance or phase measurements. This approach may be used to augment current manual procedures used in the field where chambers are in use and in manufacturing for quality control. The automated measurement may be applied to many different types and configurations of chambers. Nominal signatures and fault libraries are established and compared to test results. The tester may be built using a portable spectrum analyzer that can be easily set up in the field.

The described approach reduces the need to open a processing chamber and manually inspect all of its components. This process is tedious and imprecise. A network analyzer may be connected ex-situ or in-situ to extract an impedance fingerprint of the chamber and compare this against a library of pre-established fault signatures. Phase may also be used. In less than 10 minutes known faults may be isolated and detected. The manual troubleshooting procedures may then be guided directly toward any detected faults.

In some embodiments, a portable network analyzer is attached to the chamber with a fixture connected to a bias RF rod. The analyzer sends an RF signal over a frequency spectrum, such as 1-180 MHz, or any other suitable range and outputs an impedance spectrum that is characteristic of the chamber. Any variation from a nominal spectrum is an indication of a potential mismatch in the chamber setup. The variations may be in the parts of the chambers, connections of parts, and in the return path of the RF signal, etc.

Figure 1:
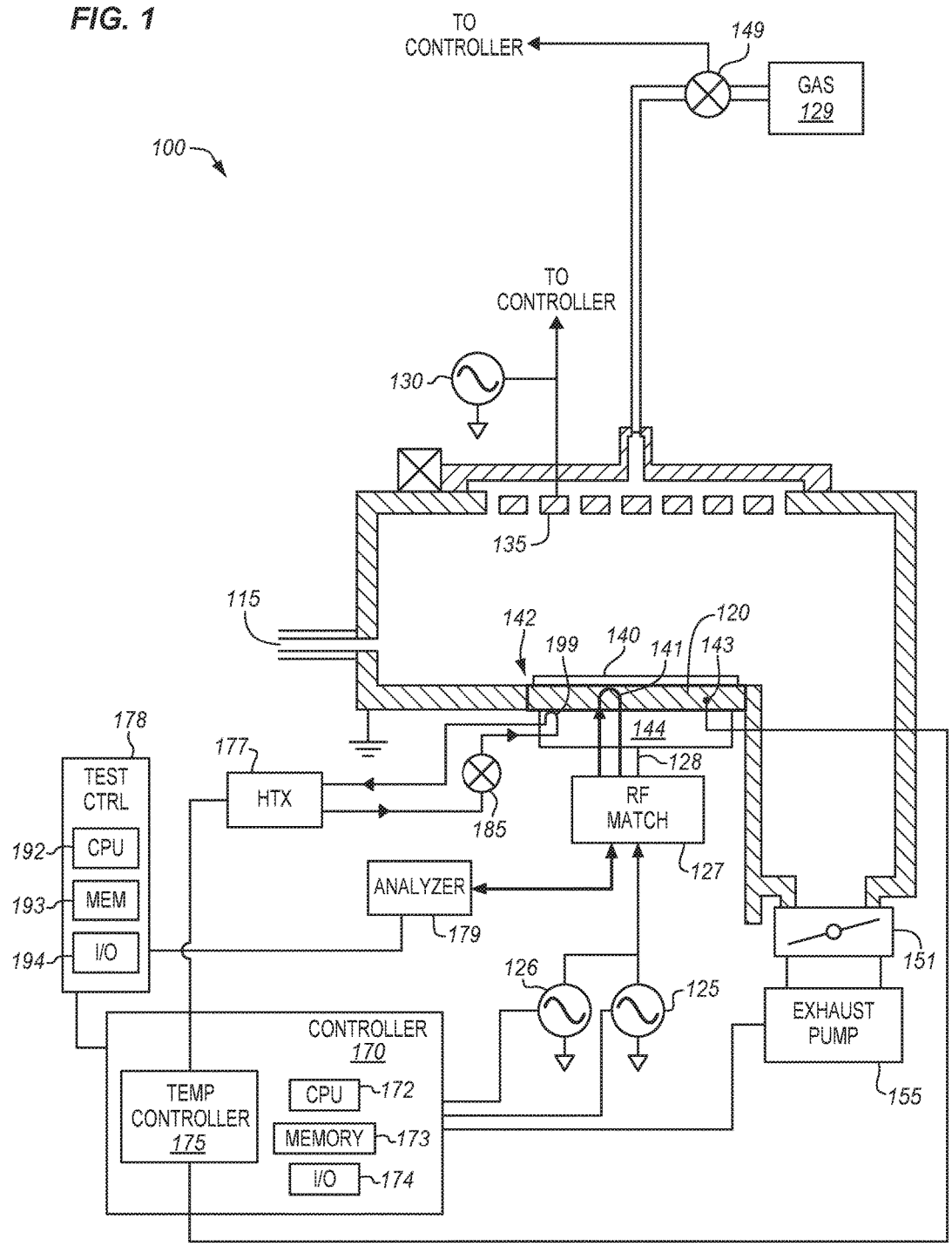
FIG. 1 is a partial cross sectional view of a processing system having a processing chamber and a connector for a network analyzer according to an embodiment.

FIG. 1 is a schematic of a plasma processing system 100 including a chuck assembly 142 in accordance with an embodiment of the present invention. The plasma etch or deposition system 100 may be any type of high performance semiconductor or microelectronic chamber suitable for plasma processing. While the exemplary embodiments are described in the context of the plasma system 100, embodiments may be adapted to suit other types of processing chambers.

The plasma processing system 100 includes a grounded chamber. Process gases are supplied from gas source(s) 129 connected to the chamber through a mass flow controller 149 to the interior of the chamber 105. Chamber 105 is evacuated via an exhaust valve 151 connected to a high capacity vacuum pump stack 155. When RF power is applied to the chamber 105, a plasma is formed in a processing region over a workpiece 140. An RF bias power 125 is coupled into a chuck assembly 142 to energize the plasma. A second RF bias power 126 may be used to provide different frequencies or amplitudes of power. Both power sources are connected to an RF match 127 that is coupled to a lower electrode 120 via a power conduit 128. An RF source power 130 is coupled through another match (not shown) to a plasma generating element 135 to provide high frequency source power to inductively or capacitively energize the plasma. The RF source power 130 may have a higher frequency than the RF bias power 125. Other power sources may be connected to provide a bias or other voltage to the chuck or other structures in the chamber.

The workpiece 140 is loaded through an opening 115 and clamped to the chuck assembly 142 inside the chamber. The workpiece may be any wafer, substrate, or other material employed in the semi-conductor processing and related arts and the present invention is not limited in this respect. The workpiece is disposed on a top surface of a dielectric layer or puck of the chuck assembly that is disposed over a cooling base assembly 144 of the chuck assembly. In an electrostatic chuck (ESC) a clamp electrode (not shown) is embedded in the dielectric layer. Other types of workpiece holders may be used as alternatives to an ESC.

A system controller 170 is coupled to a variety of different systems to control a fabrication process in the chamber. The controller 170 may include a temperature controller 175 to execute temperature control algorithms (e.g., temperature feedback control) and may be either software or hardware or a combination of both software and hardware. The system controller 170 also includes a central processing unit 172, memory 173 and input/output interface 174. The temperature controller 175 receives temperature measurements from a temperature sensor 143 and generates output control signals affecting the rate of heat transfer between the chuck assembly 142 and a heat source and/or heat sink external to the plasma chamber 105 for heater and coolant control. The system controller may control other functions of the carrier such as clamp electrodes, coolants, gas injection, and other functions not shown here in order not to obscure the features of fault detection shown here.

In embodiments, in addition to heaters, there may be coolant flow zones. In the example embodiment, the temperature controller 175 is coupled to a heat exchanger (HTX)/chiller 177. A valve 185 or other flow control device between the heat exchanger/chillers 177 and fluid conduits 199 in the chuck assembly 142 may be controlled by the temperature controller 175 to control a rate of flow of the heat transfer fluid through the conduits 199 in the chuck. The heat transfer fluid may be a liquid, such as, but not limited to deionized water/ethylene glycol, a fluorinated coolant such as Fluorinert® from 3M or Galden® from Solvay Solexis, Inc. or any other suitable dielectric fluids such as those containing perfluorinated inert polyethers.

For test purposes, a test controller 178 is coupled to a network analyzer 179. The network analyzer generates RF signals, such as a sweep signal to apply to the chamber. The network analyzer in this embodiment attaches to an RF hot rod on the lower side of the chamber. The same rod or connector that is used by the bias power sources 125, 126 may be used or an additional test interface connector may be added to the RF rod. The network analyzer may alternatively connect to the upper power source plate 135 or to any other location or fitting that allow the network analyzer to cause resonance in the chamber.

During the tests, the bias power sources 125, 126, 130 are disconnected or shut down so that the network analyzer controls the signals that are applied to the chamber. The network analyzer sends low RF power signals to the chamber at multiple frequencies within a frequency range and reads the spectral radio frequency response across this frequency spectrum. The RF signals resonate in the chamber and the network analyzer measures the RF signals resonating in the chamber. These signals may then be stored or recorded by the network analyzer or the test controller. The test controller may be an additional computing resource with a CPU 192, memory 193, and I/O 194 like the system controller 170 so that it is able to control the test of the chamber by controlling the network analyzer. The two controllers may be connected together using a local area network, peripheral device, or other connection to coordinate for testing purposes. A user interface of the test controller and of the network analyzer may be used to assess results of the tests. An actual test may be performed as multiple frequency sweeps of different amplitudes through a predetermined frequency range. The network analyzer then determines impedance, phase, amplitude, and any other desired characteristics of the RF energy in the chamber. The tests may be performed with or without a workpiece 140 in the chamber. Typically there will be no plasma and no process gases 129 during the test. The chamber may be filled with ambient air or pumped to a low pressure or near vacuum state by the exhaust system 151, 155.

The test controller 178 and the process controller 170 may both be in the form of a conventional computer that runs test, process, or temperature control software with a user interface to allow an operator to control the machine processes. The terminal may have a processor coupled to a mass storage medium, a user interface and an interface to the control box. The terminal may have other components (not shown) such as high speed memory, wireless or wired communications interfaces, additional processors, etc. The mass storage may be in the form of a machine-readable medium having instructions, parameters, and various logs, in solid state, optical, or magnetic storage. The network analyzer generates RF inputs and receives reflections in response to instructions or commands from the test controller terminal. The network analyzer may be able to operate autonomously subject to general commands from the test controller. The test controller 178 may alternatively be integrated into or a part of the network analyzer 179.

Different components of the chamber impact the impedance measurements of the chamber by the network analyzer at different frequencies. These differences allow a library of multivariate signatures, each unique to faults in different critical chamber components, to be established. A fault detection process may then be used to compare the current chamber signature with signatures in the library to identify the type of fault. The fault may be a missing component an improperly installed component or a faulty component.

Table 1 is an example table of resonance features that are sensitive to a few different types of faults. These faults are indicated generally as A, B, C, D, and E. Any faults that affect the chamber resonance may be tested. Examples of resonant frequencies are listed across the header row as 1, 2, 3, 4, 5, 6, 7, and 8. Typically these are different characteristic frequencies within a range of 1 to 200 MHz. The impact of the corresponding fault is indicated in each row at each indicated frequency. These results may be generated using specific narrowband input frequencies, by an input sweep signal, or by an input wideband signal. The table may be developed from measuring multiple resonance frequencies in a test chamber after faults were created in the chamber. This provides for nominal baseline configurations at frequencies A to H.

The chamber may be tested for any fault that exhibits an identifiable response to the input RF signal. Some mechanical faults are displaced components, missing components, unsuitable and faulty component materials, worn, cracked, and damaged components. Electrical faults can also be detected, such as short circuits, open or closed grounds, etc. The detected faults may relate to any of the components described above, such as liners, electrical assemblies, filters, screens, showerheads, etc.

As shown the chamber has a resonance at Frequency 8 and when there is a Fault A in the chamber this resonance is shifted to the right, i.e. to a higher frequency. The amount of this shift may be characterized and may vary depending on how serious the fault is and some characteristics of the fault. Different components in different chambers may also cause different amounts of shift. As shown, when this is the only change in the resonance of the chamber, then Fault A may be assessed with some certainty. There may be other faults, however, that are not indicated here and that also have an effect at Frequency 8.

Similarly Fault B has effects of attenuating a Frequency 1 resonance peak, and shifting a Frequency 2 peak and a Frequency 5 peak also to the right. Notice that the Frequency 1 peak is affected by four of the listed faults. Fault C amplifies the resonance peak, while a Fault B and Fault D attenuate the peak. Fault E eliminates the peak altogether. These combined effects make it more difficult to precisely determine the nature of the fault. Accordingly a variety of different fingerprints may be established and compared to more precisely distinguish different faults.

such a tool coupled to an RF rod or similar RF input 127 of the chamber 100, a process may start with benchmarking known good chambers. By measuring characteristics of known good chambers a database of impedance spectra may be developed. This may be used to find a baseline for variations between known good chambers. The nominal variations may be characterized.

Having established the baseline and nominal variations, faulty chambers may be measured. The sensitivity of any critical parts in the RF path to impedance changes may be measured through analyzing the RF spectrum. The impedance spectrum for each part may be used to establish fault signatures. New chambers may be tested by comparing the impedance spectra of the new chamber to the known fault signatures and the baseline chambers to detect any misplaced, misaligned, or otherwise missing parts. A wide range of different parts and their correct installation may be detected using this approach. These parts may include dielectric insulators, RF gaskets, connecting bolts, etc.

Figure 2:
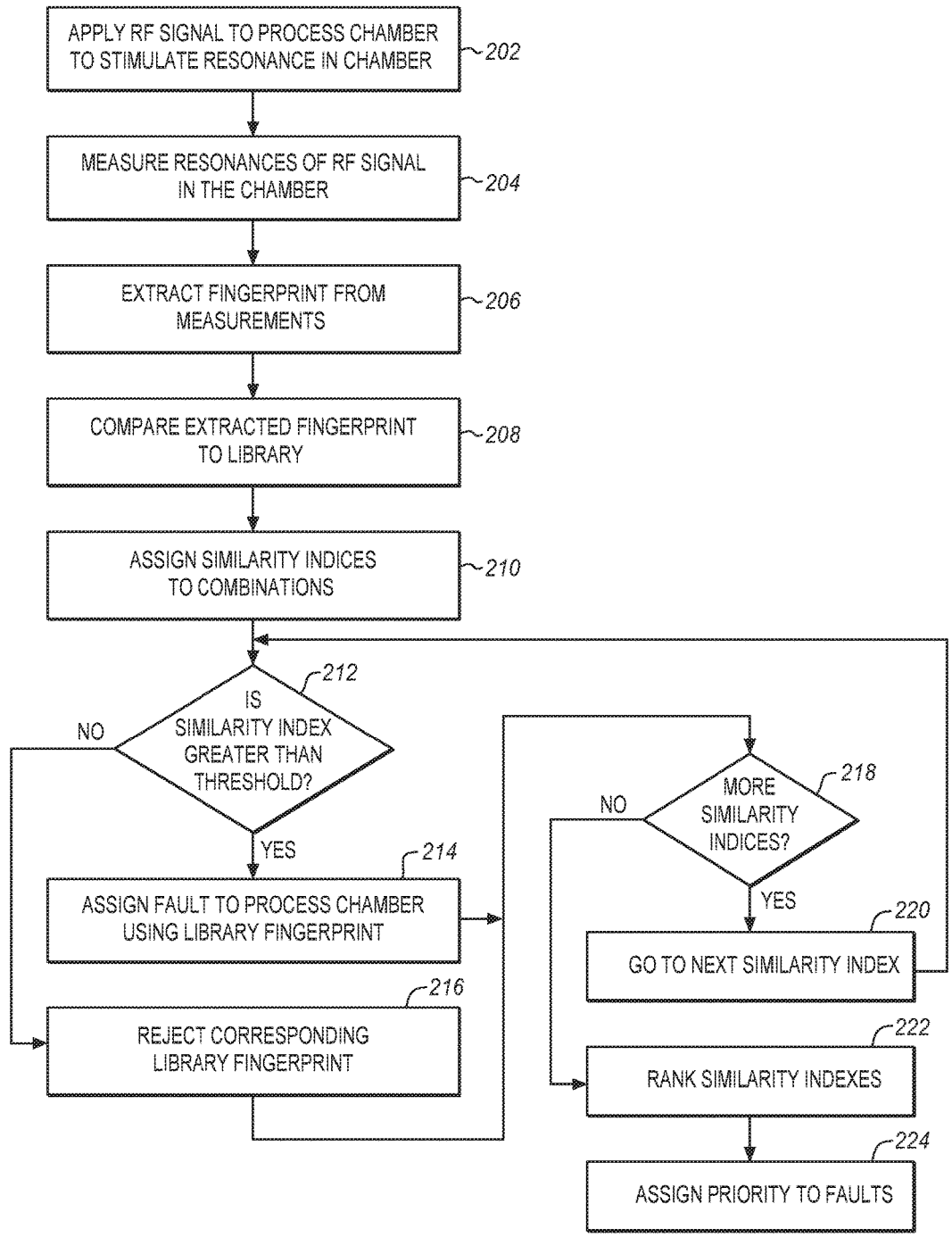
FIG. 2 is a process flow diagram of determining faults in a processing chamber according to an embodiment.

FIG. 2 is a process flow diagram of determining faults using a network analyzer and test controller. At 202 an RF signal is applied to a process chamber to stimulate a resonance in the chamber. The chamber may be a new chamber recently manufactured and subject to quality control processes prior to use. The process chamber may instead be a chamber that has been used in production processes and subject to a maintenance check or troubleshooting. At 204 resonance of the chamber in response to the applied signal is measured at the network analyzer. The network analyzer receives reflections of the applied RF signal at the same RF input and by comparing the received reflection to the original input RF signal, the network analyzer can determine resonances, absorptions and other effects on the input RF signal. The resonances may be measured in any of a variety of different ways. It has been found that impedance and phase are particularly useful as measures. The measurement

TABLE 1

|  | Freq. 1 | Freq. 2 | Freq. 3 | Freq. 4 | Freq. 5 | Freq. 6 | Freq. 7 | Freq. 8 |
|---|---|---|---|---|---|---|---|---|
| Fault A |  |  |  |  |  |  |  | Rt Shift |
| Fault B | Att | Rt Shift |  |  | Rt Shift |  |  |  |
| Fault C | Amp | Rt Shift |  |  |  |  |  |  |
| Fault D | Att | No Res |  | Rt Shift |  |  | Att. |  |
| Fault E | No Res |  | Amp |  |  | Amp |  |  |

Stated another way, Table 1 summarizes some sensitivity characteristics of a few different fault types to an impedance spectrum. The multivariate nature of the characteristics leads to unique signatures for different faults. Fault A causes resonance features at Frequency 8 and perhaps other frequencies to shift to the right. In addition, the impedance magnitude may differ by some number of ohms from a baseline corrected Fault A. In the same way Fault B causes an impact on lower frequency resonance features. Further, the larger resonance at Frequency 5 leads to an impedance difference that is much greater, in some cases, 2 orders of magnitude larger than that for Fault A. These great differences enable a robust fault classification. Smaller differences render classification more difficult.

A broadband vector network analyzer 179 may be used to measure impedance over a wide frequency range, such as 1-180 MHz. Such a network analyzer may be able to provide an input RF power and then to measure outputs that include ZMag (Impedance Magnitude), Phase angle change, and equivalent series/parallel resistance and reactance. Using in some embodiments may be for impedance (Z) and phase ($\Phi$) spectra over a large frequency band. To cover the large frequency band a sweep signal or multiple narrow band discrete signals at different frequencies may be used.

At 204 a fingerprint is extracted from the measurements. The fingerprint may take many different forms. In some embodiments, each fingerprint is characterized by the shape and the magnitude of the impedance and phase over the whole frequency band. For the network analyzer described above, the frequency band may be from 0 to 180 MHz. Mathematically, a fingerprint may be represented by a matrix with two columns, one for phase and one for impedance. The rows then correspond to a range of frequency points. The number of rows may be determined based on the precision desired and the frequency range. Such as fingerprint may be represented as a matrix FP=[Z Ø].

This fingerprint may then be compared at 208 with a library of fingerprints collected through controlled experiments as described. At 210 a similarity index may be assigned for each combination of a test fingerprint and a fingerprint in the library. The library fingerprint each relate to a particular fault that can be identified using the resonance in the chamber. In the example of Table 1, there are five different faults that have been characterized using resonance. In such a case the fingerprint library will have five different fingerprints, one for each fault. This will provide five different comparisons. The number of library fingerprints may vary for different testing scenarios. Different chambers and different configurations of the same chamber type may each have different libraries.

The similarity index gives an indication of how well the chamber resonance matches the resonance of a similar chamber that has a fault. The larger the similarity index, the higher the probability that the configuration of the chamber under test has the fault configuration identified by the fingerprint in the library. A threshold may be established to account for differences and variations that are not significant enough to indicate a fault. At 212 the similarity index for each fault is compared to the corresponding threshold.

The similarity index may be determined in any one of a variety of different ways. One way is to use a correlation coefficient. As an example, a correlation coefficient of the impedance spectrum and the phase spectrum may be separately determined. The two coefficients may then be combined in any of a variety of different ways. An average, maximum function or sum of squared values may be used, for example.

A similarity index $SI_x$ for each of x fingerprints may be characterized as the correlation of the test fingerprint $FP_{test}$ with each of x library fingerprints $FP_x$ and may be indicated as $$SI_x = corr(FP_{test}, FP_x)$$

A useful threshold may be used to establish that any similarity greater than the threshold is very likely a fault. In such a case at 214 a fault is assigned to the chamber. Similarities below the threshold are rejected at 216. This comparison is continued at 218 until all of the similarity indexes are processed at 220.

Similarity indices greater than the threshold may be ranked in descending order and be used for prioritizing appropriate troubleshooting procedures. With all of the similarity indexes processed, the system has accumulated a set of possible faults. The faults correspond to those library fingerprints that are sufficiently close to the measured fingerprint. Using the similarity indexes or the distance of each index from the corresponding threshold, the faults may be ranked at 222 to most and least likely. The faults corresponding to a higher similarity index may be ranked as more likely than those with a lower index. With the faults ranked, then at 224 a priority may be assigned to the faults. Alternatively all of the faults may be investigated regardless of ranking, priority or similarity indices.

Figure 3:
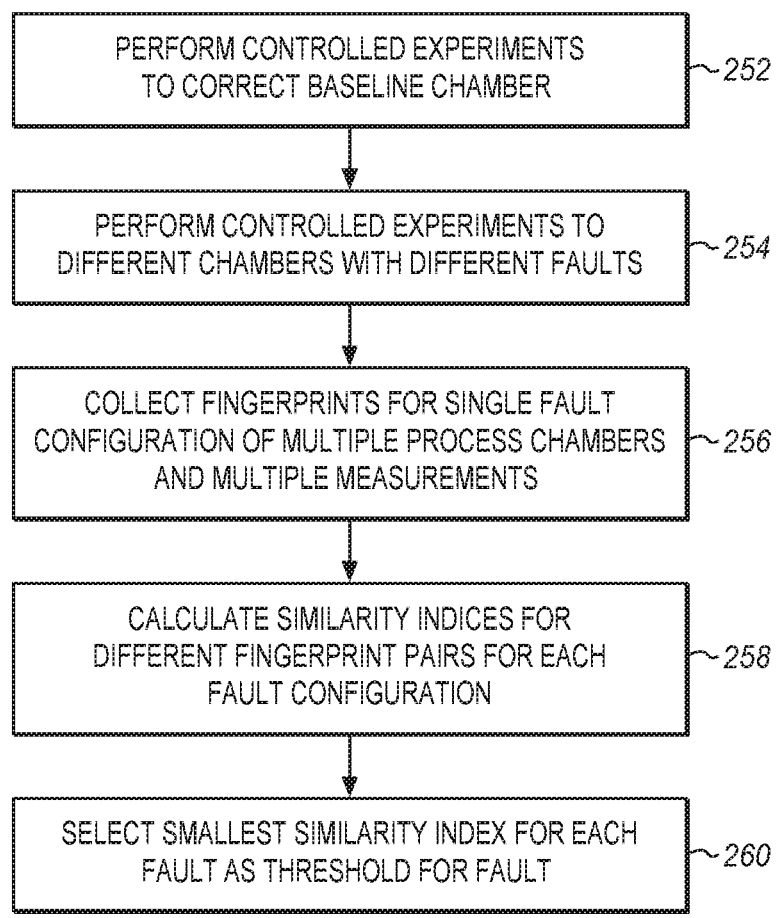
FIG. 3 is a process flow diagram of determining characteristics of faults in a processing chamber according to an embodiment.

FIG. 3 is a process flow diagram of establishing the library of fingerprints. The library is formed of a baseline resonance response and then distinctive resonance responses for different fault conditions. This may be written for n faults as:

$$Library \rightarrow \{FP_{baseline}, FP_{fault1}, FP_{fault2} \ldots FP_{faultn}\}$$

The baseline fingerprint is based on multiple measurements of a fully functioning correct fault-free version of the chamber at 252. This provides a control against which the faulty chambers may be compared. Any of variety of faults may be characterized. Typically, the faults that are most likely to occur in manufacturing or in use will be characterized. As an example, certain hardware components may be removed from the baseline configuration and then the chamber may be measured multiple times with the missing component. This may be repeated with different components removed at 254. Other faults may be tested and characterized in the same way such as hardware components with different dimensions, such as thick or thin edge rings. Hardware components with different service times, such as new, middle of service life, and end of service life may be measured. At 256 fingerprints are collected for each of the selected fault conditions and configurations.

The collected faults may all be differentiated by the shape and magnitude of the impedance and phase curves across the frequency range. Other parameters may be used instead of or in addition to impedance and phase. With the fingerprints collected, they may be used to establish the threshold for each fault condition. At 258 the fingerprints for the same configuration are compared. These may be from different tests different chambers of the same design, and different persons making the same test. Similarity indices are determined by pairing the fingerprints for the same configuration. This provides a large number of pairs as each combination is compared. The threshold may be selected at 260 as the smallest value of the similarity index. The smallest value represents the maximum variation between tests of the same fault. The threshold may be set higher or lower, depending on the particular implementation.

In this way, the threshold accounts for differences in measurement tools from measurement unit to measurement unit, for differences in how a chamber is installed and assembled, and for other trivial variations that are not significant enough to impact the performance of the chamber in use. The threshold value, in the described examples, is established so that any similarity index above the threshold is considered significant.

Figure 4:
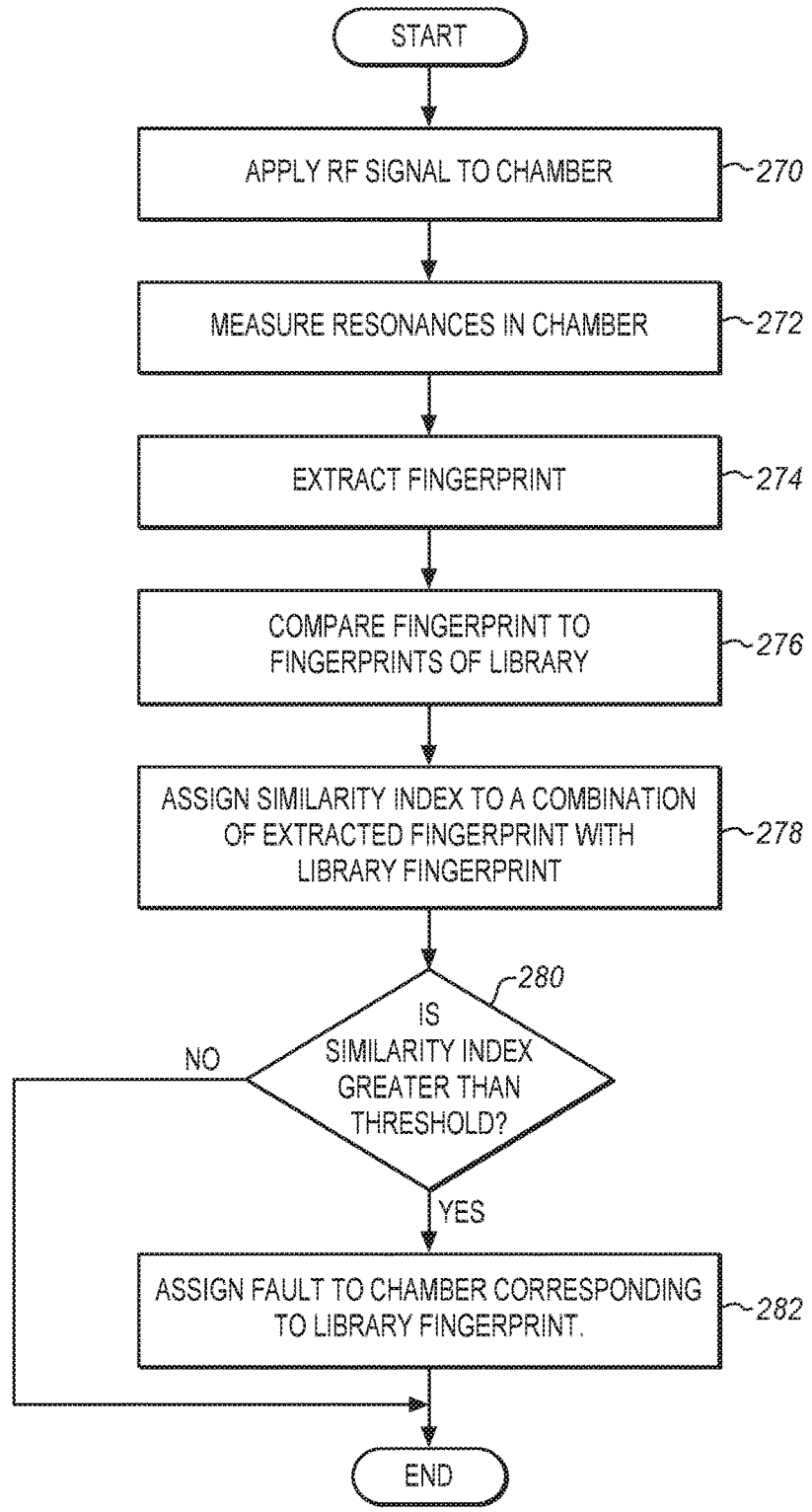
FIG. 4 is a process flow diagram of selecting a fingerprint using a threshold according to an embodiment.

FIG. 4 is a simplified process flow diagram of selecting a library fingerprint using a threshold. This approach allows a fault to be selected more quickly and simply. The process starts and then at 270 an RF signal is applied to a chamber. In the examples herein, the signal is applied by a network analyzer coupled to the RF match or another suitable RF input location on the chamber. At 272 the network analyzer measures the resonances in the chamber that are caused by the input signal. The input signal will be modified as described in reference to Table 1 with peak shifts, attenuations and amplifications.

At 274 a fingerprint is extracted from the measurement of the radio frequency spectral response. At 276 this extracted fingerprint is compared to fingerprints in the library of fingerprints. For any combinations, at 278 a similarity index is assigned to the combination of an extracted fingerprint with a library fingerprint. At 280 the index is compared to a threshold for that library fingerprint and if the similarity index is greater than the corresponding threshold, then at 282 a fault is assigned to the processing chamber. The fault will be a fault that is already identified for the library fingerprint of the combination. After any fault has been assigned then appropriate action may be taken, such as inspection, repair, replacement, refurbishment, etc. of the chamber.

As used in this description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of assigning faults to a processing chamber comprising:
    applying a radio frequency (RF) signal to a processing chamber to stimulate resonance in the chamber;
    measuring resonances of the applied RF signal in the chamber;
    extracting a fingerprint from the measured resonances;
    comparing the extracted fingerprint to a library of fingerprints, each library fingerprint being associated with a processing chamber fault;
    assigning a similarity index to combinations of the extracted fingerprint with at least one library fingerprint in the fingerprint library to form plurality of similarity indices;
    comparing each similarity index to a threshold;
    if the similarity index is greater than a threshold, then assigning a fault to the processing chamber using the associated library fingerprint; and
    subsequent to assigning the fault to the processing chamber, performing an action selected from the group consisting of inspecting the processing chamber, repairing the processing chamber, replacing at least a portion of the processing chamber, and refurbishing at least a portion of the processing chamber.

2. The method of claim 1, wherein assigning a similarity index comprises assigning a similarity index for a plurality of library fingerprints and wherein comparing comprises comparing each of the similarity indexes to the threshold, the method further comprising ranking the library fingerprints based on a value of the similarity index.

3. The method of claim 2, wherein assigning comprises assigning a fault for each of the ranked library fingerprints, the method further comprising assigning a priority to each of the assigned faults based on the ranking.

4. The method of claim 1, further comprising rejecting any library fingerprint for which the similarity index is below the threshold.

5. The method of claim 1, wherein the library of fingerprints is collected using controlled experiments applied to different chambers with different faults.

6. The method of claim 1, further comprising establishing a threshold for a library fingerprint for a single processing chamber fault configuration by:
    collecting fingerprints for a single fault configuration of multiple processing chambers and multiple measurements;
    calculating similarity indices for different pairs of the collected fingerprints for the same fault configuration; and
    selecting the smallest value of the calculated similarity index as the threshold for the fault configuration.

7. The method of claim 1, wherein the processing chamber faults comprise at least one of missing hardware components, dimensions of hardware components, and worn hardware components.

8. The method of claim 1, wherein assigning a similarity index comprises determining correlation coefficients of a measured impedance and of a measured phase and combining the correlation coefficients.

9. The method of claim 8, wherein combining the correlation coefficients comprises summing squared values of the correlation coefficients.

10. The method of claim 1, wherein applying an RF signal comprises applying an RF sweep signal that sweeps through a frequency band and wherein measuring comprises measuring across the frequency band.

11. The method of claim 1, wherein extracting a fingerprint comprises extracting a shape and a magnitude of impedance and phase over the frequency band.

12. The method of claim 11, further comprising converting the shape and magnitude into a matrix of two columns and a rows for each of a plurality of frequencies in the frequency band.

13. The method of claim 1, wherein the resonances comprise impedance resonances.

14. The method of claim 1, wherein the resonances comprise phase resonances.

15. A computer readable medium having instructions that when operated on by the computer cause the computer to perform operations comprising:
    applying a radio frequency (RF) signal to a processing chamber to stimulate resonance in the chamber;
    measuring resonances of the applied RF signal in the chamber;
    extracting a fingerprint from the measured resonances;
    comparing the extracted fingerprint to a library of fingerprints, each library fingerprint being associated with a processing chamber fault;

assigning a similarity index to combinations of the extracted fingerprint with at least one library fingerprint in the fingerprint library to form plurality of similarity indices;

comparing each similarity index to a threshold;

if the similarity index is greater than a threshold, then assigning a fault to the processing chamber using the associated library fingerprint; and subsequent to assigning the fault to the processing chamber, performing an action selected from the group consisting of inspecting the processing chamber, repairing the processing chamber, replacing at least a portion of the processing chamber, and refurbishing at least a portion of the processing chamber.

16. The medium of claim 15, wherein assigning a similarity index comprises assigning a similarity index for a plurality of library fingerprints and wherein comparing comprises comparing each of the similarity indices to the threshold, the operations further comprising ranking the library fingerprints based on a value of the similarity index.

17. The medium of claim 16, wherein assigning comprises assigning a fault for each of the ranked library fingerprints, the operations further comprising assigning a priority to each of the assigned faults based on the ranking.

18. A system for assigning faults to a processing chamber comprising:

a network analyzer to apply a radio frequency (RF) signal to a processing chamber to stimulate resonance in the chamber and to measure resonances of the applied RF signal in the chamber; and a controller to extract a fingerprint from the measured resonances, to compare the extracted fingerprint to a library of fingerprints, each library fingerprint being associated with a processing chamber fault, to assign a similarity index to combinations of the extracted fingerprint with at least one library fingerprint in the fingerprint library to form plurality of similarity indices, to compare each similarity index to a threshold, and if the similarity index is greater than a threshold, then to assign a fault to the processing chamber using the associated library fingerprint, and, subsequent to assigning the fault to the processing chamber, performing an action selected from the group consisting of inspecting the processing chamber, repairing the processing chamber, replacing at least a portion of the processing chamber, and refurbishing at least a portion of the processing chamber.

19. The system of claim 18, wherein assigning a similarity index comprises determining correlation coefficients of a measured impedance and of a measured phase and combining the correlation coefficients.

20. The system of claim 19, wherein combining the correlation coefficients comprises summing squared values of the correlation coefficients.

* * * * *